United States Patent
Aruga et al.

(10) Patent No.: US 8,611,094 B2
(45) Date of Patent: Dec. 17, 2013

(54) OPTICAL MODULE

(75) Inventors: Hiroshi Aruga, Tokyo (JP); Hideyuki Ohashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 64 days.

(21) Appl. No.: 13/021,966

(22) Filed: Feb. 7, 2011

(65) Prior Publication Data

US 2012/0008289 A1    Jan. 12, 2012

(30) Foreign Application Priority Data

Jul. 8, 2010   (JP) .................................. 2010-155471

(51) Int. Cl.
*H05K 1/00* (2006.01)
*G02B 6/42* (2006.01)

(52) U.S. Cl.
CPC .................................. *G02B 6/4281* (2013.01)
USPC ......................................... 361/749; 174/268

(58) Field of Classification Search
CPC .................................................... G02B 6/4281
USPC .................. 174/268, 110 R, 117 F, 254, 255; 361/749, 750, 776, 794
See application file for complete search history.

(56) References Cited

U.S. PATENT DOCUMENTS

| | | | | |
|---|---|---|---|---|
| 5,414,220 A | * | 5/1995 | Hanato et al. ................... | 174/254 |
| 5,742,484 A | * | 4/1998 | Gillette et al. ................. | 361/789 |
| D483,338 S | | 12/2003 | Takagi et al. | |
| D484,105 S | | 12/2003 | Takagi et al. | |
| D494,147 S | | 8/2004 | Takagi et al. | |
| 6,797,891 B1 | * | 9/2004 | Blair et al. ..................... | 174/268 |
| D505,664 S | | 5/2005 | Takagi et al. | |
| D514,531 S | | 2/2006 | Takagi et al. | |
| D518,797 S | | 4/2006 | Takagi et al. | |
| 7,249,897 B2 | | 7/2007 | Aruga | |
| 2003/0219209 A1 | * | 11/2003 | Kunkel et al. ................... | 385/52 |
| 2004/0264882 A1 | * | 12/2004 | Torigoe et al. .................. | 385/88 |
| 2007/0053639 A1 | * | 3/2007 | Aruga .............................. | 385/94 |

FOREIGN PATENT DOCUMENTS

| | | |
|---|---|---|
| CN | 1578588 A | 2/2005 |
| JP | 2005-32815 | 2/2005 |
| JP | 2007-71980 | 3/2007 |

OTHER PUBLICATIONS

Combined Office Action and Search Report issued May 3, 2013 in Chinese Patent Application No. 201110046994.7 (with Partial English translation).

* cited by examiner

*Primary Examiner* — Yuriy Semenenko
(74) *Attorney, Agent, or Firm* — Oblon, Spivak, McClelland, Maier & Neustadt, L.L.P.

(57) ABSTRACT

Provided is an optical module in which wiring density may be reduced to ensure isolation between lines to reduce crosstalk. A flexible printed circuit includes: dielectric layers; a first pattern facing portion including a first ground conductor pattern and a first wiring pattern electrically connected to an electric terminal, which are facing each other through the dielectric layer; and a second pattern facing portion including a second ground conductor pattern and a second wiring pattern electrically connected to the electric terminal, which are facing each other through the dielectric layer, the second pattern facing portion facing the first pattern facing portion, in which when the dielectric layer is bent along a portion between the first pattern facing portion and the second pattern facing portion, at least one of the first ground conductor pattern and the second ground conductor pattern is located between the first wiring pattern and the second wiring pattern.

7 Claims, 7 Drawing Sheets

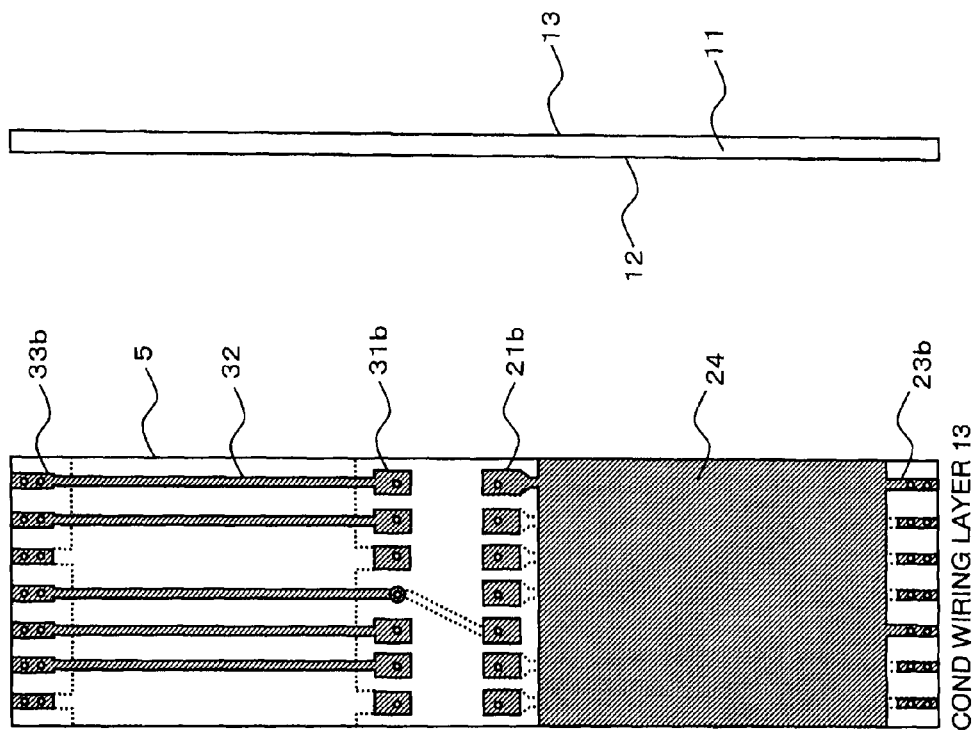
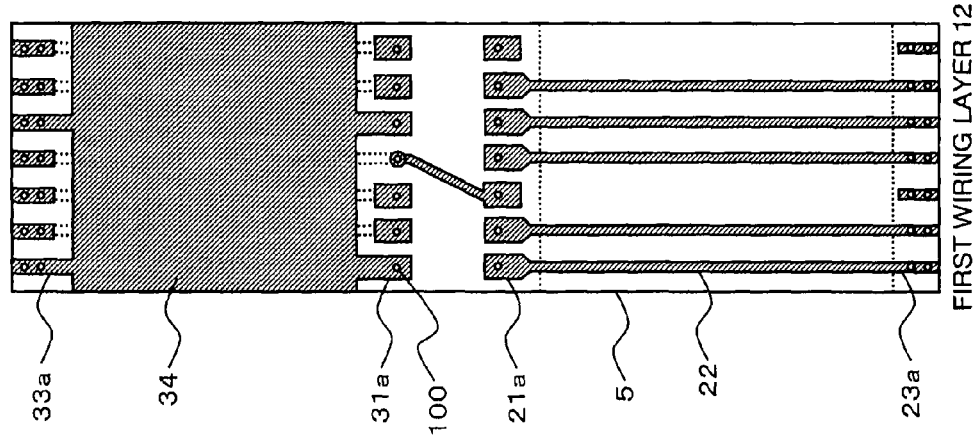

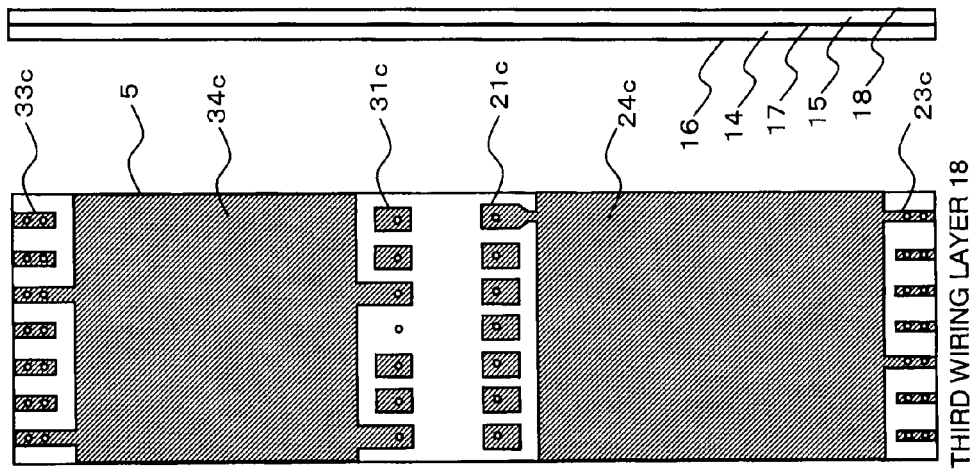
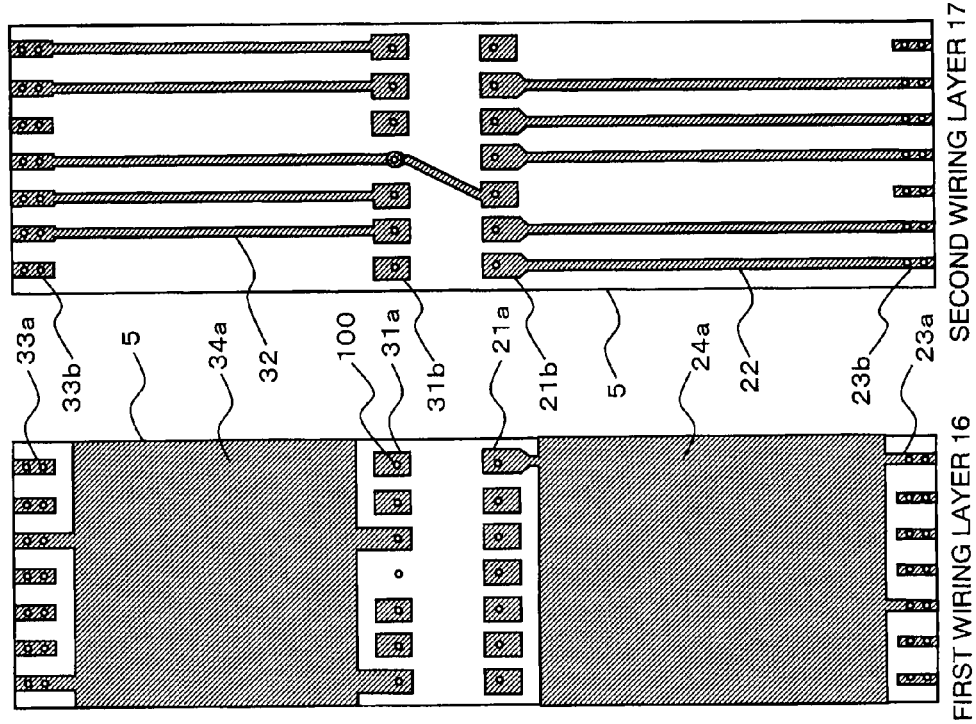
FIG.4A  FIRST WIRING LAYER 16
FIG.4B  SECOND WIRING LAYER 17
FIG.4C  THIRD WIRING LAYER 18
FIG.4D

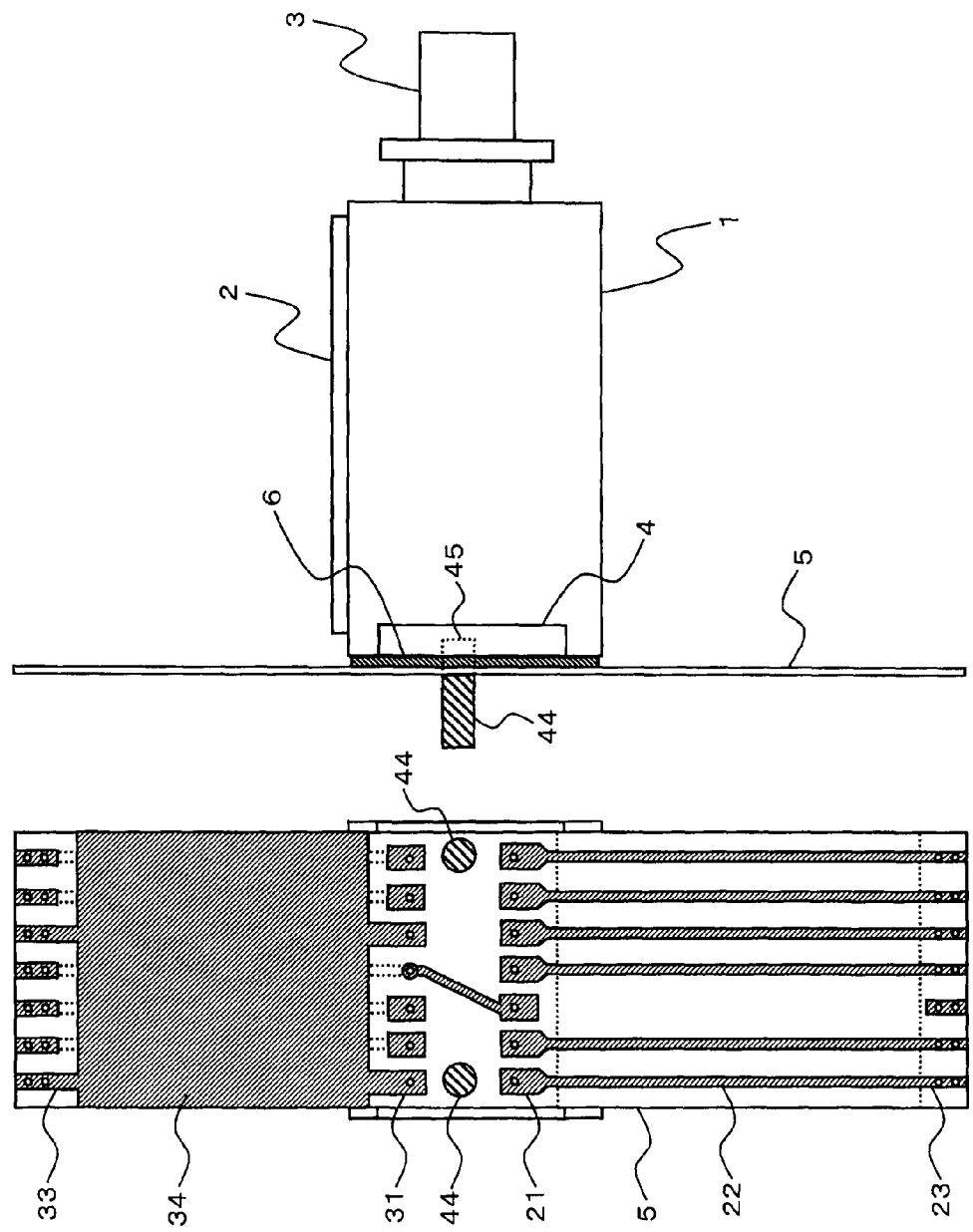

OPTICAL MODULE

BACKGROUND OF THE INVENTION

1. Field of the Invention

The present invention relates to an optical module for use in optical communication, and more particularly, to an optical module that is electrically connected through a flexible printed circuit to a circuit board for driving the optical module.

2. Description of the Related Art

A conventional optical module includes a package that accommodates a carrier on which an optical device is mounted, an optical connector that is disposed on one end of the package, a feedthrough that is disposed on the other end of the package, and a flexible printed circuit that is fixed to the feedthrough (for example, see JP 2007-71980 A).

The feedthrough is formed of laminated ceramic, and has electric terminals (radio-frequency terminal and bias terminal) which are disposed on an outer surface of the package perpendicularly to an optical axis of input/output light to/from an optical connector, and a carrier connection terminal which is disposed on an inner surface of the package so as to be connected to the electric terminals.

The flexible printed circuit has an end of one surface stuck onto an entire surface of the feedthrough by an anisotropically conductive adhesive. The flexible printed circuit has connection pads disposed at positions that face the electric terminals of the feedthrough. Here, the anisotropically conductive adhesive is thermally cured while being crimped under pressure, to thereby exhibit conductivity only between the surfaces facing each other.

The feedthrough and the flexible printed circuit are allowed to adhere to each other with the anisotropically conductive adhesive so that the electric terminals disposed on the feedthrough and the connection pads disposed on the flexible printed circuit are electrically connected to each other. Consequently, the degree of freedom for the mechanical viewpoint can be secured. Further, the optical module has no member inhibiting a radio-frequency characteristic, such as a lead pin, and hence the radio-frequency characteristic can be also ensured.

However, the conventional technology suffers from the following problems.

In the conventional optical module, when an optical device having a plurality of channels is incorporated into one package, the density of the electric terminals disposed on the feedthrough becomes higher. This leads to a problem that the wiring density of the flexible printed circuit becomes too high to physically arrange the wiring of the flexible printed circuit.

When the wiring density of the flexible printed circuit becomes higher, a radio-frequency line (RF line) that is disposed on the flexible printed circuit and connected to the radio-frequency terminal, and a bias line (DC line) that is similarly connected to the bias terminal cross each other. For this reason, isolation between those lines cannot be ensured, resulting in problems that a signal in an adjacent channel produces crosstalk, and that an output signal crosses over into an input signal to oscillate.

It is conceivable that the flexible printed circuit is configured by a multilayer structure having three or more layers to reduce the wiring density of each layer in the flexible printed circuit. This leads to another problem that the bending property of the flexible printed circuit is deteriorated to reduce the mounting property on the circuit board.

SUMMARY OF THE INVENTION

The present invention has been made to solve the above-mentioned problems, and an object of the present invention is to provide an optical module in which wiring density may be reduced without deterioration of a bending property of a flexible printed circuit, to thereby ensure isolation between lines to reduce crosstalk.

An optical module according to the present invention includes: a package accommodating an optical device therein; a feedthrough disposed on one end side of the package, including, on an outer surface of the package, an electric terminal electrically connected to the optical device on an inner surface of the package; and a flexible printed circuit fixed to the feedthrough, in which the flexible printed circuit includes: dielectric layers; a first pattern facing portion including a first ground conductor pattern and a first wiring pattern electrically connected to the electric terminal, which are facing each other through the dielectric layer; and a second pattern facing portion including a second ground conductor pattern and a second wiring pattern electrically connected to the electric terminal, which are facing each other through the dielectric layer, and the second pattern facing portion facing the first pattern facing portion in a length direction of the dielectric layer, and when the dielectric layer is bent along a portion between the first pattern facing portion and the second pattern facing portion, at least one of the first ground conductor pattern and the second ground conductor pattern is located between the first wiring pattern and the second wiring pattern.

According the optical module of the present invention, the flexible printed circuit includes: the dielectric layers; the first pattern facing portion including the first ground conductor pattern and the first wiring pattern electrically connected to the electric terminal, which are facing each other through the dielectric layer; and the second pattern facing portion including the second ground conductor pattern and the second wiring pattern electrically connected to the electric terminal, which are facing each other through the dielectric layer. The second pattern facing portion faces the first pattern facing portion in the length direction of the dielectric layer. When the dielectric layer is bent along the portion between the first pattern facing portion and the second pattern facing portion, at least one of the first ground conductor pattern and the second ground conductor pattern is located between the first wiring pattern and the second wiring pattern.

Therefore, the wiring density may be reduced without deterioration of the bending property of the flexible printed circuit, to thereby ensure the isolation between the lines to reduce crosstalk.

BRIEF DESCRIPTION OF THE DRAWINGS

In the accompanying drawings:

FIG. 3A is a front view illustrating a first wiring layer of a flexible printed circuit of FIGS. 2A and 2B;

FIG. 3B is a front view transmissively illustrating a second wiring layer of the flexible printed circuit of FIGS. 2A and 2B;

FIG. 3C is a side view illustrating the flexible printed circuit of FIGS. 2A and 2B;

FIG. 4A is a front view illustrating a first wiring layer of a flexible printed circuit according to a second embodiment of the present invention;

FIG. 4B is a front view transmissively illustrating a second wiring layer of the flexible printed circuit of the second embodiment;

FIG. 4C is a front view transmissively illustrating a third wiring layer of the flexible printed circuit of the second embodiment;

FIG. 4D is a side view illustrating the flexible printed circuit of the second embodiment;

FIG. 7A is a front view illustrating an optical module according to a fifth embodiment of the present invention; and FIG. 7B is a side view illustrating the optical module of the fifth embodiment.

DETAILED DESCRIPTION OF THE PREFERRED EMBODIMENTS

Hereinafter, an optical module according to preferred embodiments of the present invention is described with reference to the accompanying drawings. In the respective drawings, identical or corresponding parts are denoted by the same reference symbols.

First Embodiment

Figure 1:
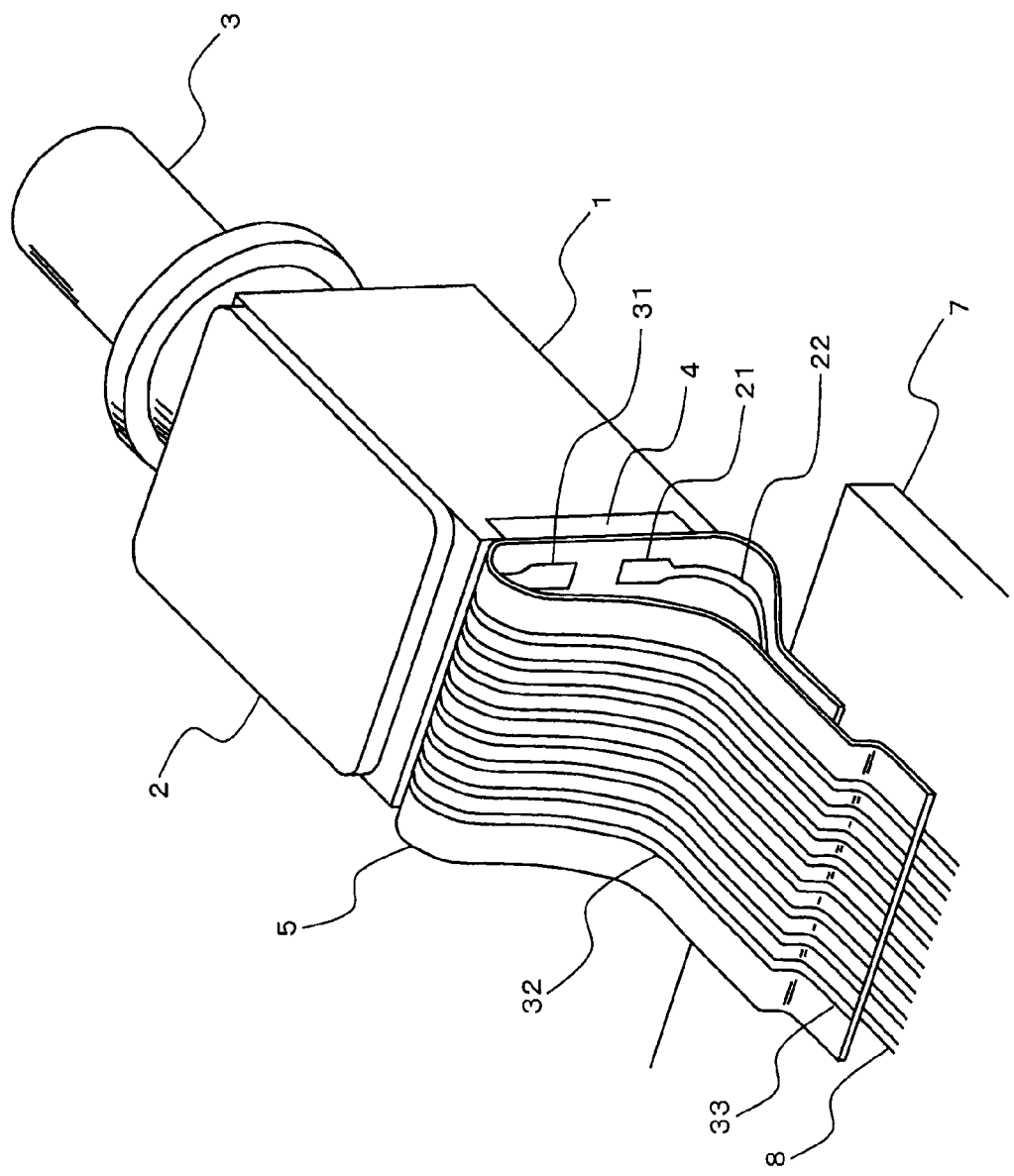
FIG. 1 is a perspective view illustrating an optical module according to a first embodiment of the present invention, together with a printed circuit board.
Figure 2A:
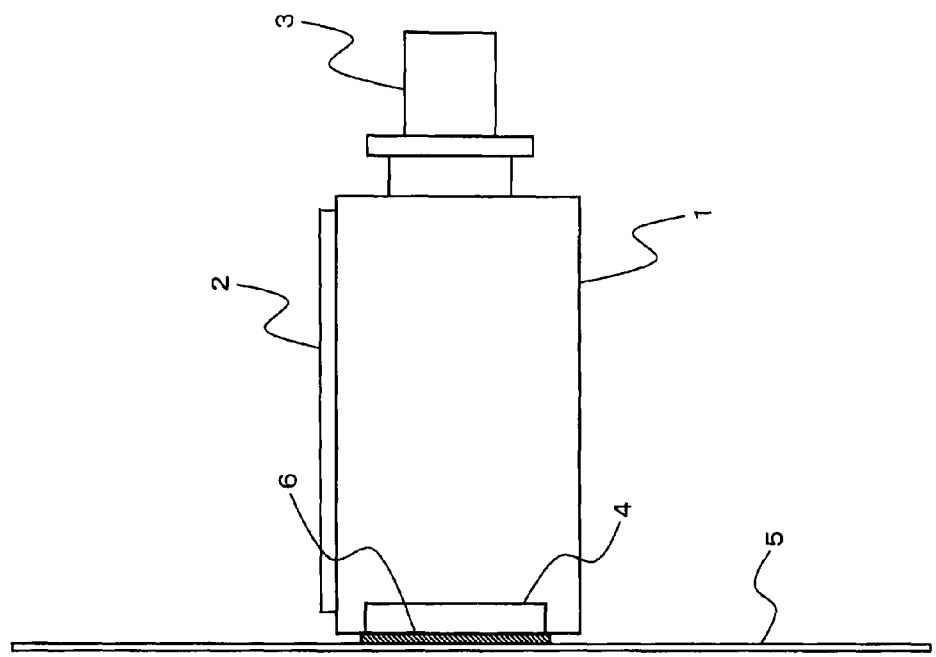
FIG. 2A is a front view illustrating the optical module of FIG. 1.
Figure 2B:
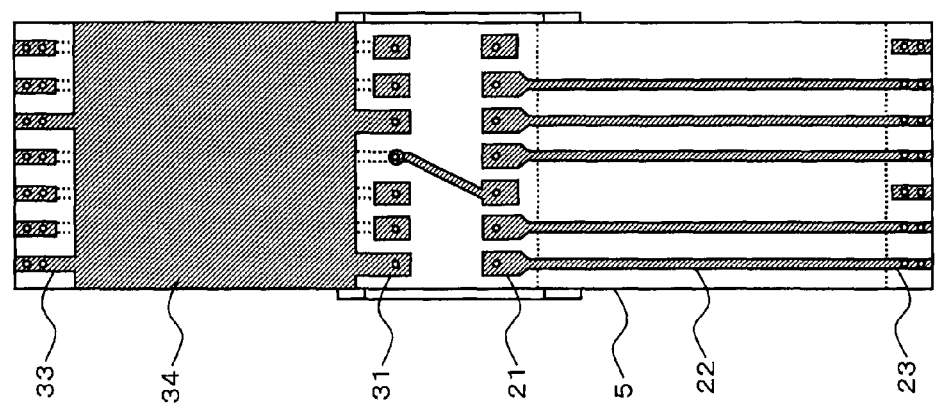
FIG. 2B is a side view illustrating the optical module of FIG. 1.

FIG. 1 is a perspective view illustrating an optical module according to a first embodiment of the present invention, together with a printed circuit board 7 (circuit board). FIG. 2A is a front view illustrating the optical module of FIG. 1, and FIG. 2B is a side view illustrating the optical module. FIG. 1 illustrates a state in which a flexible printed circuit 5 is bent for connection to the printed circuit board 7, and FIGS. 2A and 2B each illustrate a state before the optical module is connected to the printed circuit board 7, in which the flexible printed circuit 5 is not bent.

As illustrated in FIGS. 1, 2A, and 2B, the optical module includes a package 1, a cover 2 for the package 1, a receptacle 3, a feedthrough 4, and the flexible printed circuit 5.

The package 1 accommodates a carrier (not shown) having an optical device such as, for example, an optical modulator mounted thereon.

The receptacle 3 is disposed on one end side of the package 1, which serves as an input/output port of an optical signal and forms an optical connector. The receptacle 3 is connected to an optical fiber (not shown). The feedthrough 4 is disposed on another end side (the other end side) of the package 1, and serves as an input/output port of an electric signal. The feedthrough 4 is formed of, for example, laminated ceramic.

In the feedthrough 4, electric terminals (high frequency terminal and bias terminal) (not shown) are disposed on an outer surface of the package 1, perpendicularly to an optical axis of light incident on and exiting from the receptacle 3. The electric terminals are electrically connected to the optical device on an inner surface of the package 1. The flexible printed circuit 5 has a band-like shape, and an intermediate portion of the flexible printed circuit 5 in the length direction is adhered to the feedthrough 4 with an anisotropically conductive adhesive 6.

The flexible printed circuit 5 has first feedthrough connection pads 21 and second feedthrough connection pads 31 disposed at positions facing the electric terminals of the feedthrough 4. As described above, the anisotropically conductive adhesive 6 exhibits conductivity only between the surfaces facing each other. Therefore, the respective electric terminals of the feedthrough 4 are electrically connected to the first feedthrough connection pads 21 and to the second feedthrough connection pads 31.

Each of the first feedthrough connection pads 21 is connected to a corresponding first flexible printed circuit wiring pattern 22 and a corresponding first printed circuit board connection pad 23. Each of the first feedthrough connection pads 21 is electrically connected to the printed circuit board 7 through the corresponding first printed circuit board connection pads 23. On the other hand, each of the second feedthrough connection pads 31 is connected to a corresponding second flexible printed circuit wiring pattern 32 and a corresponding second printed circuit board connection pad 33. Each of the second feedthrough connection pads 31 is electrically connected to the printed circuit board 7 through the corresponding second printed circuit board connection pad 33.

The second flexible printed circuit wiring patterns 32 extend toward an opposite side of the first flexible printed circuit wiring patterns 22 with respect to the length direction of the flexible printed circuit 5. That is, the second flexible printed circuit wiring patterns 32 face the respective first flexible printed circuit wiring patterns 22 in the length direction of the flexible printed circuit 5. The detailed configuration of the flexible printed circuit 5 is described later with reference to FIGS. 3A to 3C.

Printed circuit board wirings 8 are formed on the printed circuit board 7. The first printed circuit board connection pads 23 and the second printed circuit board connection pads 33 are electrically connected respectively to the printed circuit board wirings 8, and connected to another component (not shown) on the printed circuit board 7. For this reason, the second flexible printed circuit wiring patterns 32 are so arranged as to cover the respective first flexible printed circuit wiring patterns 22 and the respective first printed circuit board connection pads 23.

Subsequently, a detailed configuration of the flexible printed circuit 5 is described with reference to FIGS. 3A, 3B, and 3C. FIG. 3A is a front view illustrating a first wiring layer 12 of the flexible printed circuit 5 of FIGS. 2A and 2B, FIG. 3B is a front view transmissively illustrating a second wiring layer 13 of the flexible printed circuit 5, and FIG. 3C is a side view illustrating the flexible printed circuit 5.

As illustrated in FIGS. 3A, 3B, and 3C, the flexible printed circuit 5 includes a dielectric layer 11, the first wiring layer 12 formed on one surface of the dielectric layer 11, and the second wiring layer 13 formed on the other surface of the dielectric layer 11. In FIGS. 3A, 3B, and 3C, portions common to the first wiring layer 12 and the second wiring layer 13 are denoted by the same reference numerals. However, those formed in the first wiring layer 12 are affixed with "a", while those formed in the second wiring layer 13 are affixed with "b". When those portions are collectively referred to, "a" and "b" are not affixed.

The first wiring layer 12 includes a plurality of first feedthrough connection pads 21a, a plurality of first printed circuit board connection pads 23a, and a plurality of the first flexible printed circuit wiring patterns 22 that connect between the respective first feedthrough connection pads 21a and the respective first printed circuit board connection pads 23a. The first wiring layer 12 also includes a plurality of second feedthrough connection pads 31a, a plurality of second printed circuit board connection pads 33a, and a second ground conductor 34 that is disposed throughout an area between the second feedthrough connection pads 31a and the second printed circuit board connection pads 33a.

The second wiring layer 13 includes a plurality of first feedthrough connection pads 21b, a plurality of first printed circuit board connection pads 23b, and a first ground conductor 24 that is disposed throughout an area between the first feedthrough connection pads 21b and the first printed circuit board connection pads 23b. The second wiring layer 13 also includes a plurality of second feedthrough connection pads 31b, a plurality of second printed circuit board connection pads 33b, and the plurality of second flexible printed circuit wiring patterns 32 that connect between the respective second feedthrough connection pads 31b and the respective second printed circuit board connection pads 33b.

The first feedthrough connection pads 21a formed on the first wiring layer 12 and the first feedthrough connection pads 21b formed on the second wiring layer 13 are electrically connected to each other through respective through-holes 100 penetrating the dielectric layer 11. Likewise, the respective first printed circuit board connection pads 23a and 23b, the respective second feedthrough connection pads 31a and 31b, and the respective second printed circuit board connection pads 33a and 33b are electrically connected to each other, penetrating the dielectric layer 11.

In this example, the first feedthrough connection pads 21a, the first flexible printed circuit wiring patterns 22, and the first printed circuit board connection pads 23a are referred to as "first wiring pattern". The first feedthrough connection pads 21b, the first ground conductor 24, and the first printed circuit board connection pads 23b are referred to as "first ground conductor pattern". The first wiring pattern faces the first ground conductor pattern through the dielectric layer 11. Those patterns facing each other across the dielectric layer 11 are referred to as "first pattern facing portion".

The second feedthrough connection pads 31a, the second flexible printed circuit wiring patterns 32, and the second printed circuit board connection pads 33a are referred to as "second wiring pattern". The second feedthrough connection pads 31b, the second ground conductor 34, and the second printed circuit board connection pads 33b are referred to as "second ground conductor pattern". The second wiring pattern faces the second ground conductor pattern across the dielectric layer 11. The patterns facing each other through the dielectric layer 11 are referred to as "second pattern facing portion".

A positional relationship between the ground conductor and the wiring pattern is determined so that at least one of the first ground conductor 24 and the second ground conductor 34 is located between the first wiring pattern and the second wiring pattern when the dielectric layer 11 is bent along a portion between the first pattern facing portion and the second pattern facing portion.

Subsequently, an operation of the optical module configured as described above is described. Here, description is given of a case in which a signal is output from the package 1 through the feedthrough 4. In the description, a case of outputting a signal is exemplified. However, the flow of the signal is reversible, and hence the same operation is also applied to a case of inputting a signal to the package 1 through the feedthrough 4.

First, signals from the package 1 are output to the respective first feedthrough connection pads 21 and the respective second feedthrough connection pads 31 through the electric terminals of the feedthrough 4.

The signals output to the respective first feedthrough connection pads 21 are transmitted through the respective first flexible printed circuit wiring patterns 22. In this case, on the rear surfaces of the first flexible printed circuit wiring patterns 22, the first ground conductor 24 is formed across the dielectric layer 11. For this reason, the respective first flexible printed circuit wiring patterns 22 and the first ground conductor 24 are electromagnetically coupled to each other to form so-called "microstrip lines", which enables the transmission of a radio frequency signal. The signals that have been transmitted through the respective first flexible printed circuit wiring patterns 22 are output to the respective first printed circuit board connection pads 23, and then output to the printed circuit board 7.

Likewise, the signals output to the respective second feedthrough connection pads 31 are transmitted to the respective second flexible printed circuit wiring patterns 32. In this case, on the rear surfaces of the second flexible printed circuit wiring patterns 32, the second ground conductor 34 is formed across the dielectric layer 11. For this reason, the respective second flexible printed circuit wiring patterns 32 and the second ground conductor 34 are electromagnetically coupled to each other to form so-called "microstrip lines", which enables the transmission of a radio frequency signal. The signals that have been transmitted through the respective second flexible printed circuit wiring patterns 32 are output to the respective second printed circuit board connection pads 33, and then output to the printed circuit board 7.

In general, in microstrip lines, most of an electric field is distributed between the signal lines on the surface and the ground conductor to transmit signals. However, some of the signals are distributed in space. Likewise, in the first flexible printed circuit wiring patterns 22, some of the signals are radiated to space. In this situation, as described above, the second flexible printed circuit wiring patterns 32 are arranged above the first flexible printed circuit wiring patterns 22 (see FIG. 1).

For this reason, if the conductive layer such as the ground conductor is not provided between the first flexible printed circuit wiring patterns 22 and the second flexible printed circuit wiring patterns 32, the signal components distributed to space are recoupled to the second flexible printed circuit wiring patterns 32. The signals that are transmitted through the respective first flexible printed circuit wiring patterns 22 and recoupled to the respective second flexible printed circuit wiring patterns 32 are different from the signals that are originally transmitted through the respective second flexible printed circuit wiring patterns 32. Accordingly, those signals recoupled to the respective second flexible printed circuit wiring patterns 32 form interfering waves, and induce interference.

However, in the optical module according to the first embodiment of the present invention, the second ground conductor 34 is arranged between the first flexible printed circuit wiring patterns 22 and the second flexible printed circuit wiring patterns 32. For this reason, the signals radiated from the first flexible printed circuit wiring patterns 22 are blocked by the second ground conductor 34. Therefore, the signals are not coupled to the second flexible printed circuit wiring patterns 32.

Likewise, the signals that are transmitted through the respective second flexible printed circuit wiring patterns 32 are partially radiated to space. However, the second ground conductor 34 is arranged between the first flexible printed circuit wiring patterns 22 and the second flexible printed circuit wiring patterns 32. Therefore, the radiated signals are not coupled to the first flexible printed circuit wiring patterns 22.

As described above, the second ground conductor 34 is arranged between the first flexible printed circuit wiring patterns 22 and the second flexible printed circuit wiring patterns 32, and hence the signals radiated from the first flexible printed circuit wiring patterns 22 are blocked by the second ground conductor 34. For this reason, the signals radiated from the first flexible printed circuit wiring patterns 22 are not coupled to the second flexible printed circuit wiring patterns 32, with the result that electromagnetic interference may be suppressed.

In addition to the first flexible printed circuit wiring patterns 22, the second flexible printed circuit wiring patterns 32 also contribute to wiring to the printed circuit board 7. Therefore, as compared with the above-mentioned conventional flexible printed circuit, when the same line widths and the same line pitches are provided, double wiring can be performed.

Further, one flexible printed circuit 5 is provided, and hence the flexible printed circuit 5 can be attached to the feedthrough 4 by one adhesion, with the result that the mounting costs can be made equal to those in the conventional optical module.

As described above, according to the first embodiment, the flexible printed circuit includes: the dielectric layer; the first pattern facing portion including the first ground conductor pattern and the first wiring pattern electrically connected to the electric terminals, which face each other across the dielectric layer; and the second pattern facing portion including the second ground conductor pattern and the second wiring pattern electrically connected to the electric terminals, which face each other across the dielectric layer, the second pattern facing portion facing the first pattern facing portion in the length direction of the dielectric layer. When the dielectric layer is bent along a portion between the first pattern facing portion and the second pattern facing portion, at least one of the first ground conductor pattern and the second ground conductor pattern is located between the first wiring pattern and the second ground conductor pattern.

Accordingly, the wiring density is reduced without deterioration of the bending property of the flexible printed circuit, so that isolation between the lines may be ensured, to thereby reduce crosstalk. Also, a single flexible printed circuit is provided, and hence the connection to the feedthrough can be easily attained.

In the above first embodiment, description has been given of the case in which the second ground conductor 34 is disposed between the first flexible printed circuit wiring patterns 22 and the second flexible printed circuit wiring patterns 32. However, the present invention is not limited to this configuration. Alternatively, the first ground conductor 24 may be arranged between the first flexible printed circuit wiring patterns 22 and the second flexible printed circuit wiring patterns 32. Still alternatively, the first ground conductor 24 and the second ground conductor 34 can be arranged between the first flexible printed circuit wiring patterns 22 and the second flexible printed circuit wiring patterns 32.

Second Embodiment

In the above-mentioned first embodiment, description has been given of the case in which the second ground conductor 34 is arranged between the first flexible printed circuit wiring patterns 22 and the second flexible printed circuit wiring patterns 32 to suppress the electromagnetic interference between the first flexible printed circuit wiring patterns 22 and the second flexible printed circuit wiring patterns 32. In a second embodiment, description is given of a configuration capable of suppressing the electromagnetic interference with respect to an external signal.

FIG. 4A is a front view illustrating a first wiring layer 16 of the flexible printed circuit 5 according to the second embodiment of the present invention, FIG. 4B is a front view transmissively illustrating a second wiring layer 17 of the flexible printed circuit 5, FIG. 4C is a front view transmissively illustrating a third wiring layer 18 of the flexible printed circuit 5, and FIG. 4D is a side view illustrating the flexible printed circuit 5.

As illustrated in FIGS. 4A to 4D, the flexible printed circuit 5 includes two dielectric layers 14 and 15, the first wiring layer 16 formed on one of outer surfaces of the dielectric layers 14 and 15, the second wiring layer 17 formed between the dielectric layers 14 and 15, and a third wiring layer 18 formed on the other outer surface of the dielectric layers 14 and 15. In FIGS. 4A to 4D, portions common to the first to third wiring layers 16 to 18 are denoted by the same reference numerals. However, those formed in the first wiring layer 16 are affixed with "a", those formed in the second wiring layer 17 are affixed with "b", and those formed in the third wiring layer 18 are affixed with "c". When those portions are collectively referred to, "a", "b" and "c" are not affixed.

The first wiring layer 16 includes a plurality of the first feedthrough connection pads 21a, a plurality of the first printed circuit board connection pads 23a, and a first ground conductor 24a disposed throughout an area between the first feedthrough connection pads 21a and the first printed circuit board connection pads 23a. The first wiring layer 16 includes a plurality of the second feedthrough connection pads 31a, a plurality of the second printed circuit board connection pads 33a, and a second ground conductor 34a disposed throughout an area between the second feedthrough connection pads 31a and the second printed circuit board connection pads 33a.

The second wiring layer 17 includes a plurality of the first feedthrough connection pads 21b, a plurality of the first printed circuit board connection pads 23b, and a plurality of the first flexible printed circuit wiring patterns 22 that connect between the respective first feedthrough connection pads 21b and the respective first printed circuit board connection pads 23b. The second wiring layer 17 further includes a plurality of the second feedthrough connection pads 31b, a plurality of the second printed circuit board connection pads 33b, and a plurality of the second flexible printed circuit wiring patterns 32 that connect between the respective second feedthrough connection pads 31b and the respective second printed circuit board connection pads 33b.

The third wiring layer 18 includes a plurality of first feedthrough connection pads 21c, a plurality of first printed circuit board connection pads 23c, and a first ground conductor 24c disposed throughout an area between the first feedthrough connection pads 21c and the first printed circuit board connection pads 23c. The third wiring layer 18 further includes a plurality of second feedthrough connection pads 31c, a plurality of second printed circuit board connection pads 33c, and a second ground conductor 34c disposed throughout an area between the second feedthrough connection pads 31c and the second printed circuit board connection pads 33c.

The first feedthrough connection pads 21a formed in the first wiring layer 16, the first feedthrough connection pads 21b formed in the second wiring layer 17, and the first feedthrough connection pads 21c formed in the third wiring layer 18 are electrically connected to each other through the through-holes 100 penetrating the dielectric layers 14 and 15. Likewise, the respective first printed circuit board connection pads 23a, 23b, and 23c, the respective second feedthrough connection pads 31a, 31b, and 31c, and the respective second printed circuit board connection pads 33a, 33b, and 33c are electrically connected to each other, penetrating the dielectric layers 14 and 15.

That is, the electric terminals of the feedthrough 4 are electrically connected to the first feedthrough connection pads 21a, 21b, 21c and to the second feedthrough connection pads 31a, 31b, 31c.

In this example, the first feedthrough connection pads 21a, the first ground conductor 24a, and the first printed circuit board connection pads 23a are referred to as "first ground conductor pattern". The first feedthrough connection pads 21b, the first flexible printed circuit wiring patterns 22, and the first printed circuit board connection pads 23b are referred to as "first wiring pattern". The first feedthrough connection pads 21c, the first ground conductor 24c, and the first printed circuit board connection pads 23c are also referred to as "first ground conductor pattern". The two first ground conductor patterns and the first wiring pattern, which face each other across through the dielectric layers 14 and 15, are referred to as "first pattern facing portion".

The second feedthrough connection pads 31a, the second ground conductor 34a, and the second printed circuit board connection pads 33a are referred to as "second ground conductor pattern". The second feedthrough connection pads 31b, the second flexible printed circuit wiring patterns 32, and the second printed circuit board connection pads 33b are referred to as "second wiring pattern". The second feedthrough connection pads 31c, the second ground conductor 34c, and the second printed circuit board connection pads 33c are also referred to as "second ground conductor pattern". The two second ground conductor patterns and the second wiring pattern, which face each other across the dielectric layers 14 and 15, are referred to as "second pattern facing portion".

Subsequently, an operation of the optical module configured as described above is described. As in the above-mentioned first embodiment, description is given of a case in which a signal is output from the package 1 through the feedthrough 4. The same operation is conducted even in a case where a signal is input to the package 1 through the feedthrough 4.

First, signals from the package 1 are output to the respective first feedthrough connection pads 21 and the respective second feedthrough connection pads 31 through the electric terminals of the feedthrough 4.

The signals output to the first feedthrough connection pads 21 are transmitted through the first flexible printed circuit wiring patterns 22. The first ground conductors 24a and 24c are formed on both surfaces of the first flexible printed circuit wiring patterns 22 across the dielectric layers 14 and 15, respectively. With this configuration, the first flexible printed circuit wiring patterns 22 and the first ground conductors 24a and 24c are electromagnetically coupled to each other to form so-called "triplate lines", which enables the transmission of a radio wave signal. The signals that have been transmitted through the first flexible printed circuit wiring patterns 22 are output to the respective first printed circuit connection pads 23, and then output to the printed circuit board 7.

Likewise, the signals output to the respective second feedthrough connection pads 31 are transmitted to the second flexible printed circuit wiring patterns 32. In this case, the second ground conductors 34a and 34c are formed on the both surfaces of the second flexible printed circuit wiring patterns 32 across the dielectric layers 14 and 15, respectively. With this configuration, the second flexible printed circuit wiring patterns 32 and the second ground conductors 34a and 34c are electromagnetically coupled to each other to form so-called "triplate lines", which enables the transmission of a radio wave signal. The signals that have been transmitted through the second flexible printed circuit wiring patterns 32 are output to the respective second printed circuit connection pads 33, and then output to the printed circuit board 7.

In the optical module according to the second embodiment of the present invention, the first ground conductors 24a and 24c are formed on the both surfaces of the first flexible printed circuit wiring patterns 22, and the second ground conductors 34a and 34c are formed on the both surfaces of the second flexible printed circuit wiring patterns 32. With this configuration, the electromagnetic interference of the first flexible printed circuit wiring patterns 22 with the second flexible printed circuit wiring patterns 32 may be suppressed, and the electromagnetic interference with respect to an external signal may be also suppressed.

As described above, according to the second embodiment, the first pattern facing portion includes two layers of the first ground conductor patterns. The two layers of the first ground conductor patterns face the both surfaces of the first wiring pattern through the respective dielectric layers. The second pattern facing portion includes two layers of the second ground conductor patterns. The two layers of the second ground conductor patterns face both surfaces of the second wiring pattern through the respective dielectric layers.

With the above-mentioned configuration, the wiring density of the flexible printed circuit is reduced, so that isolation between the lines may be ensured, to thereby reduce crosstalk. Also, a single flexible printed circuit is provided, and hence the connection to the feedthrough can be easily attained. Further, isolation with respect to an external signal is ensured so as to reduce crosstalk.

Third Embodiment

In the above-mentioned first and second embodiments, description has been give of the case in which the flexible printed circuit 5 is adhered to the feedthrough 4 with the anisotropically conductive adhesive 6. However, the present invention is not limited to this configuration. Alternatively, the flexible printed circuit 5 may be connected to the feedthrough 4 with the aid of a solder material. In a third embodiment, description is given of a configuration in which the flexible printed circuit 5 is connected to the feedthrough 4 with the aid of a solder material.

Figure 5C:
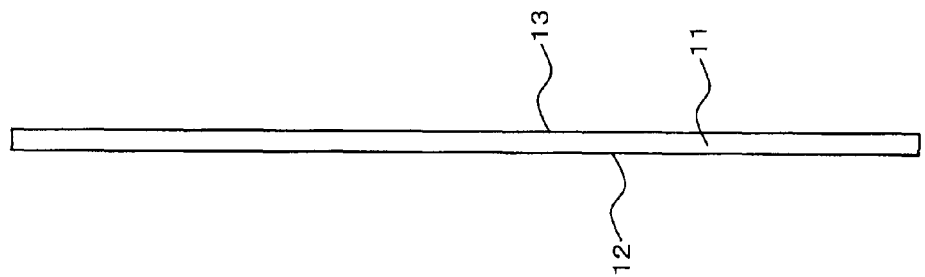
FIG. 5C is a side view illustrating the flexible printed circuit of the third embodiment.
Figure 5B:
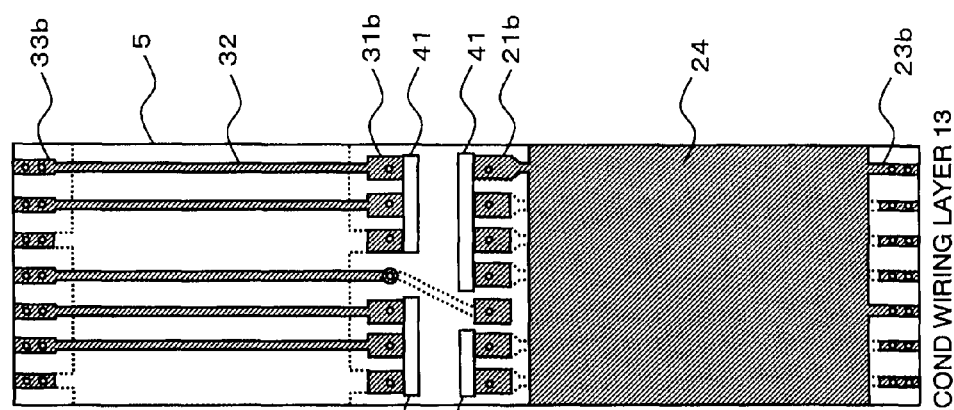
FIG. 5B is a front view transmissively illustrating a second wiring layer of the flexible printed circuit of the third embodiment.
Figure 5A:
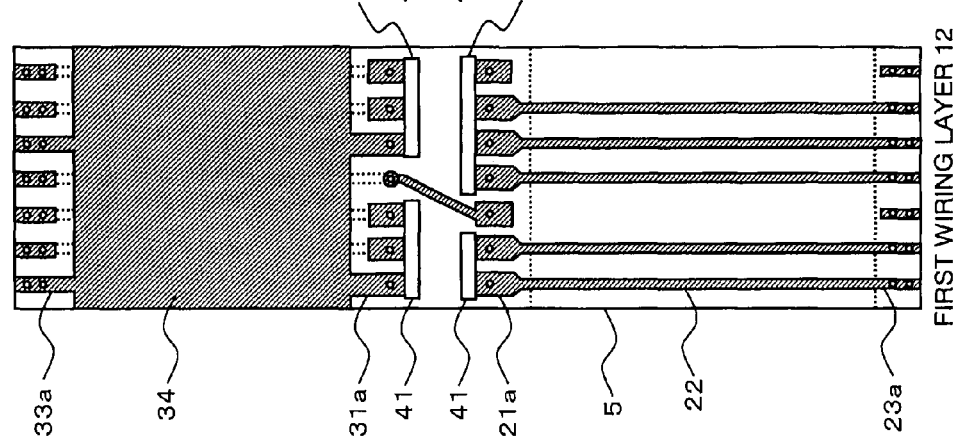
FIG. 5A is a front view illustrating a first wiring layer of a flexible printed circuit according to a third embodiment of the present invention.

FIG. 5A is a front view illustrating the first wiring layer 12 of the flexible printed circuit 5 according to the third embodiment of the present invention, FIG. 5B is a front view transmissively illustrating the second wiring layer 13 of the flexible printed circuit 5, and FIG. 5C is a side view illustrating the flexible printed circuit 5.

As illustrated in FIGS. 5A and 5B, solder mounting holes 41 are formed in the flexible printed circuit 5 so as to be adjacent to the first feedthrough connection pads 21 and the second feedthrough connection pads 31. The solder mounting holes 41 are opened to penetrate the dielectric layer 11. Other configurations are identical with the above-mentioned configurations of FIGS. 3A to 3C, and therefore their description is omitted.

When the flexible printed circuit 5 is soldered to the feedthrough 4 by soldering, there arises a problem with the control of the amount of a solder material. That is, when the amount of solder material is small, a sufficient joint strength cannot be ensured. On the other hand, when the amount of solder material is excessive, the solder material spreads out from between the electric terminals of the feedthrough 4 and the first feedthrough connection pads 21 or the second feedthrough connection pads 31. This leads to a risk that short-circuiting is induced between the other electric terminal and the feedthrough connection pads.

In view of the above-mentioned circumstances, the solder mounting holes 41 are provided, so that the soldering material overflowing by soldering the electric terminals of the feedthrough 4 to the first feedthrough connection pads 21 and the second feedthrough connection pads 31 may be led into the solder mounting holes 41. For this reason, even when the solder material is slightly excessive, the amount of solder material is adjusted by the solder mounting holes 41, to thereby prevent short-circuiting from occurring between the other electric terminal and the feedthrough connection pads.

Fourth Embodiment

In the above-mentioned first to third embodiments, description has been give of the case in which the flexible printed circuit 5 is fixed to the feedthrough 4 with an anisotropically conductive adhesive 6 or a soldering material. Alternatively, the flexible printed circuit 5 may be fixed to the feedthrough 4 also with the aid of a fixing jig. In a fourth embodiment, description is given of a configuration in which the flexible printed circuit 5 is fixed to the feedthrough 4 with the aid of a fixing jig.

Figures 6A, 6B:
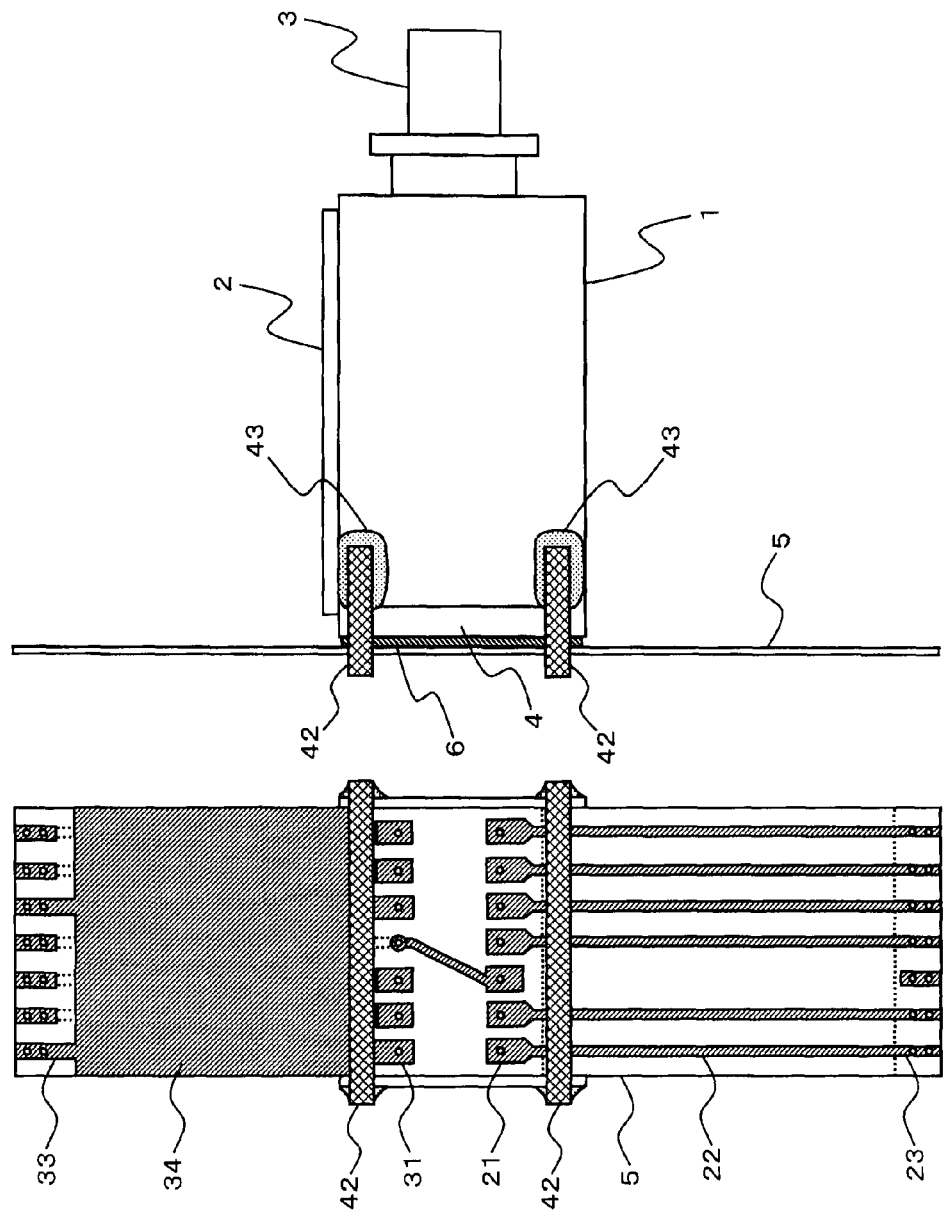
FIG. 6A is a front view illustrating an optical module according to a fourth embodiment of the present invention.
FIG. 6B is a side view illustrating the optical module of the fourth embodiment.

FIG. 6A is a front view illustrating an optical module according to the fourth embodiment of the present invention, and FIG. 6B is a side view illustrating the optical module. As illustrated in FIGS. 6A and 6B, U-shaped reinforcement members 42 are so disposed as to cover the flexible printed circuit 5. Each of the reinforcement members 42 is made of a nonmetal material such as acrylic or plastic, and fixedly adhered to the package 1 through a reinforcement adhesive 43. Other configurations are identical with the above-mentioned configurations of FIGS. 2A and 2B, and therefore their description is omitted.

When the flexible printed circuit 5 is bent along a connection interface with the feedthrough 4, portions to be bent are forcibly determined by the reinforcement members 42. Therefore, the joint portion of the anisotropically conductive adhesive 6 or of the solder material may not be applied with a stress, and hence the flexible printed circuit 5 may be prevented from being bent at the joint portion. The reinforcement members 42 are made of a nonmetal material, and hence, even if the reinforcement members 42 are so arranged as to cover the first flexible printed circuit wiring patterns 22 and the second flexible printed circuit wiring patterns 32, the disturbance of an electromagnetic field is small, and the reinforcement members 42 hardly affect the transmission characteristic of the signal.

Accordingly, the bending portion of the flexible printed circuit 5 is forcibly fixed by the reinforcement members 42 thus provided. Therefore, even if the anisotropically conductive adhesive or the solder material which cannot ensure sufficient joint strength is used, sufficient joint strength can be ensured.

Fifth Embodiment

In the above-mentioned first to fourth embodiments, description has been give of the case in which the flexible printed circuit 5 is fixed to the feedthrough 4 with the anisotropically conductive adhesive 6 or the soldering material. In this case, the flexible printed circuit 5 and the feedthrough 4 may be positioned with the aid of positioning pins and positioning holes. In a fifth embodiment, description is given of a configuration in which the flexible printed circuit 5 and the feedthrough 4 are positioned with the aid of positioning pins.

FIG. 7A is a front view illustrating an optical module according to a fifth embodiment of the present invention, and FIG. 7B is a side view illustrating the optical module. As illustrated in FIGS. 7A and 7B, the flexible printed circuit 5 and the feedthrough 4 are formed with positioning holes 45 for allowing positioning pins 44 to be inserted thereinto. Other configurations are identical with the above-mentioned configurations of FIGS. 2A and 2B, and therefore their description is omitted.

In general, the flexible printed circuit 5 and the feedthrough 4 are positioned by seeing through the contours of the first feedthrough connection pads 21 and the second feedthrough connection pads 31, and the contours of the electric terminals of the feedthrough 4. In contrast, in the optical module according to the fifth embodiment of the present invention, when the flexible printed circuit 5 is connected to the feedthrough 4, the positioning pins 44 are inserted into the positioning holes 45 from the flexible printed circuit 5 side. Accordingly, the flexible printed circuit 5 and the feedthrough 4 can be uniquely positioned.

As described above, the flexible printed circuit 5 and the feedthrough 4 are uniquely positioned, and hence the positioning is performed with precision. Therefore, pad pitches of the first feedthrough connection pads 21 and the second feedthrough connection pads 31 may be made narrower to increase the wiring density of the flexible printed circuit 5. Also, the flexible printed circuit 5 and the feedthrough 4 may be uniquely positioned, and hence the time it takes to connect the flexible printed circuit 5 to the feedthrough 4 may be reduced.

What is claimed is:

1. An optical module, comprising:
    a package accommodating an optical device therein;
    a feedthrough disposed on one end side of the package, the feedthrough being electrically connected to the optical device inside the package; and
    a flexible printed circuit including a fixed portion that is fixed to the feedthrough,
    wherein the flexible printed circuit comprises:
        at least one dielectric layer;
        a first pattern facing portion including a first ground conductor pattern and a first wiring pattern that is electrically connected to the feedthrough with the first ground conductor pattern and the first wiring pattern facing each other through the at least one dielectric layer; and
        a second pattern facing portion including a second ground conductor pattern and a second wiring pattern that is electrically connected to the feedthrough, the second wiring pattern facing portion facing the first pattern facing portion in a length direction of the at least one dielectric layer at the fixed portion of the flexible printed circuit, and
    wherein the flexible printed circuit is bent away from the fixed portion to provide connections to another circuit element with at least one of the first ground conductor pattern and the second ground conductor pattern being located between the first wiring pattern and the second wiring pattern along the entire length thereof extending from the fixed portion.

2. An optical module according to claim 1,
wherein there are plural dielectric layers,
wherein the first pattern facing portion includes two layers of the first ground conductor patterns, and the two layers of the first ground conductor patterns face both surfaces of the first wiring pattern through the dielectric layers, and
wherein the second pattern facing portion includes two layers of the second ground conductor patterns, and the two layers of the second ground conductor patterns face both surfaces of the second wiring pattern through the dielectric layers.

3. An optical module according to claim 1,
wherein the fixed portion of the flexible printed circuit is fixed to the feedthrough with an anisotropically conductive adhesive.

4. An optical module according to claim 1,
wherein the first pattern facing portion and the second pattern facing portion are electrically connected to the feedthrough with a solder material.

5. An optical module according to claim 4,
wherein the flexible printed circuit further comprises:
a first feedthrough connection pad and a second feedthrough connection portion pad, which are facing the feedthrough; and
a solder mounting hole formed therein so as to be adjacent to the first feedthrough connection pad and the second feedthrough connection pad.

6. An optical module according to claim 1,
further comprising a reinforcement member disposed to cover the flexible printed circuit and fixed to the package.

7. An optical module according to claim 1,
wherein each of the flexible printed circuit and the feedthrough further includes a positioning hole formed therein, into which a positioning pin for positioning the flexible printed circuit and the feedthrough is inserted.

* * * * *